(12) United States Patent
Evan et al.

(10) Patent No.: US 12,599,863 B2
(45) Date of Patent: Apr. 14, 2026

(54) AIR PURIFIER WITH INTEGRATED ELECTRONICS COOLING

(71) Applicant: BISSELL Inc., Grand Rapids, MI (US)

(72) Inventors: Teresa R Evan, Lake Orion, MI (US); Alexander M. Schroeder, Grand Rapids, MI (US)

(73) Assignee: BISSELL Inc., Grand Rapids, MI (US)

( * ) Notice: Subject to any disclaimer, the term of this patent is extended or adjusted under 35 U.S.C. 154(b) by 394 days.

(21) Appl. No.: 18/349,305

(22) Filed: Jul. 10, 2023

(65) Prior Publication Data

US 2024/0033673 A1      Feb. 1, 2024

Related U.S. Application Data

(60) Provisional application No. 63/393,027, filed on Jul. 28, 2022.

(51) Int. Cl.
| | |
|---|---|
| *B01D 46/42* | (2006.01) |
| *B01D 46/00* | (2022.01) |
| *B01D 46/52* | (2006.01) |
| *H02J 50/10* | (2016.01) |
| *H05K 7/20* | (2006.01) |

(52) U.S. Cl.
CPC ..... *B01D 46/4263* (2013.01); *B01D 46/0004* (2013.01); *B01D 46/0043* (2013.01); *B01D 46/521* (2013.01); *H02J 50/10* (2016.02);

*H05K 7/20145* (2013.01); *B01D 46/0047* (2013.01); *B01D 2201/301* (2013.01); *B01D 2273/30* (2013.01)

(58) Field of Classification Search
CPC ............ B01D 2279/45; B01D 2273/30; B01D 46/4245; B01D 35/30; F25D 17/042
See application file for complete search history.

(56) References Cited

U.S. PATENT DOCUMENTS

| | | | |
|---|---|---|---|
| 2022/0212133 A1* | 7/2022 | Kim ........................ | F24F 8/108 |
| 2024/0019139 A1* | 1/2024 | Wesley ............... | B01D 46/0027 |

* cited by examiner

*Primary Examiner* — Jennifer Dieterle
*Assistant Examiner* — Rachel Marie Slaugovsky
(74) *Attorney, Agent, or Firm* — Quinn IP Law

(57) ABSTRACT

An air purifier includes a housing having a vented upper surface, a motorized fan assembly positioned within an interior volume of the housing and operable for discharging a filtered airstream through the vented upper surface, a hollow top cover, and an electric circuit, e.g., wireless charging electronics. The hollow top cover at least partially defines therein an electronics bay, floor vents configured to admit a portion of the filtered airstream into the electronics bay as a cooling airstream, at least one primary exhaust port for discharging the filtered airstream to a surrounding ambient environment, and at least one secondary exhaust port for discharging the cooling airstream to the surrounding ambient environment. The electric circuit is positioned in the electronics bay within the cooling airstream.

20 Claims, 9 Drawing Sheets

AIR PURIFIER WITH INTEGRATED ELECTRONICS COOLING

CROSS-REFERENCE TO RELATED APPLICATIONS

This application claims priority to and the benefit of U.S. Provisional Application Ser. No. 63/393,027 filed on Jul. 28, 2022, which is hereby incorporated by reference in its entirety.

TECHNICAL FIELD

The subject disclosure generally pertains to air purifiers having a motorized fan assembly operable for moving ambient air through one or more layers of filter media, and for discharging a filtered airstream to a surrounding ambient environment. In particular, the subject disclosure pertains to an electronic cooling feature that is integrated into the air purifier.

BACKGROUND

Air purifiers of the forced-air type typically include a structural housing containing a motorized fan assembly and filter media. When the motorized fan assembly is energized, fan blades are caused to rotate at a high rate of speed to draw ambient airflow into the housing. The airflow passes through an internal volume of the housing where it is filtered through one or more layers or types of filter media. The level of filtration provided by a given air purifier varies with the construction of the filter media. For instance, high-efficiency particulate air (HEPA) filters are a popular choice due to the capability of HEPA filter media to reduce common airborne allergens and pollutants such as pet dander, pollen, smoke particles, mold spores, bacteria, and dust mites. The airflow in certain types of air purifiers is also deodorized via the process of vapor adsorption, typically by directing the airflow through an activated carbon wrap or media bed before ultimately discharging the filtered, purified, and deodorized air back into the surrounding ambient environment.

BRIEF SUMMARY

An air purifier as described herein is equipped with an electronics cooling feature that utilizes the relatively strong flow of a filtered airstream to actively cool a heat-generating electric circuit. Such an electric circuit, which is exemplified herein as wireless charging coils and associated electronics for charging a smartphone or another portable electronic device, is positioned within an electronics bay. The electronics bay in turn is located within a hollow top cover of the air purifier. A portion of the filtered airstream is admitted through vents into the hollow top cover to function as a cooling airflow, whereupon the cooling airflow circulates around the electric circuit. Heat is transferred from the electric circuit to the cooling airflow and ultimately exhausted to the surrounding ambient environment.

As appreciated in the art, inductive charging circuits and other electric circuits can generate substantial waste heat during their operation. This occurs as electric current passes through the various resistive elements and transfer conductors. For example, a wireless charging circuit employs tightly wound copper loops or coils that radiate waste heat as a byproduct of the electromagnetic induction process. Similarly, factors such as interference or a misalignment of the cell phone or other charging device with the wireless charging electronics can lead to increased heating and reduced charging efficiency. However, the rate of thermal dissipation using passive approaches may not optimally protect the charging device and/or the electric circuit. It is therefore desirable to extract waste heat at an increased rate. This goal is accomplished herein using a modified hollow top cover, e.g., a flat tabletop accessory, in conjunction with the air purifier.

To that end, the hardware solutions described in detail hereinbelow take advantage of relatively high flow rates of the filtered airstream that is discharged from the air purifier to help cool the electric circuit within the above-noted electronics bay. The electronics bay is positioned within the exhaust flow within the hollow top cover of the air purifier. Vents formed within a floor of the hollow top cover admit some of the filtered airstream as the cooling airflow, with the remainder of the filtered airstream being discharged to the surrounding ambient environment in the traditional manner, e.g., through one or more primary exhaust ports of the hollow top cover.

As the cooling airflow circulates within the cooling hay, heat from the resident electric circuit is transferred to the cooling airflow and exhausted from one or more secondary exhaust ports provided in the hollow top cover. When the electric circuit includes or embodies wireless charging electronics as noted above, the hollow top cover may have a flat upper surface on which a user may place the charging device to commence wireless charging thereof. In other words, a user may enjoy the use of the air purifier in two different capacities: (1) as an air purifier and, if so desired, (2) as a wireless charging stand. The powerful airflow driven by the air purifier's motorized fan assembly thus facilitates faster charging at a higher wattage in this exemplary embodiment of the electric circuit without costly components, and without bulky heat sinks or other passive cooling mechanisms.

In accordance with one or more exemplary embodiments, the air purifier may include a housing having a vented upper surface, and a motorized fan assembly positioned within an interior volume of the housing and operable for discharging a filtered airstream through the vented upper surface. The air purifier also includes a hollow top cover and an electric circuit. The hollow top cover at least partially defines therein an electronics bay, floor vents configured to admit at least a portion of the filtered airstream into the electronics bay as a cooling airstream, at least one primary exhaust port for discharging the filtered airstream to a surrounding ambient environment, and at least one secondary exhaust port for discharging the cooling airstream to the surrounding ambient environment. The electric circuit is positioned in the electronics bay within the cooling airstream.

An aspect of the disclosure includes a hollow top cover assembly for the above-summarized air purifier. An embodiment of the hollow top cover assembly includes a cover piece forming a ceiling of an electronics bay, and a floor defining floor vents configured to admit a portion of the filtered airstream into the electronics bay as a cooling airstream when the hollow top cover is connected to or positioned on the vented upper surface. Angled sidewalls are connected to the cover piece and define at least one secondary exhaust port for discharging the cooling airstream to the surrounding ambient environment. The assembly also includes a pedestal connected to the floor. The pedestal at least partially defines at least one primary exhaust port configured to discharge the filtered airstream to the surrounding ambient environment. An electric circuit is positioned in the electronics bay within the cooling airstream.

Also described herein is a method for cooling an electric circuit using an air purifier. An embodiment of the method entails positioning a hollow top cover on a vented upper surface of the air purifier, the hollow top cover defining therein an electronics bay containing an electric circuit, floor vents configured to admit a portion of a filtered airstream from the air purifier into the electronics bay as a cooling airstream, at least one primary exhaust port for discharging the filtered airstream to a surrounding ambient environment, and at least one secondary exhaust port for discharging the cooling airstream to the surrounding ambient environment. The method also includes generating the filtered airstream via the motorized fan assembly, and directing the cooling airstream through the floor vents and into the electronics bay to thereby cool the electric circuit.

The above summary is not intended to represent every possible embodiment or every aspect of the subject disclosure. Rather, the foregoing summary is intended to exemplify some of the novel aspects and features disclosed herein. The above features and advantages, and other features and advantages of the subject disclosure, will be readily apparent from the following detailed description of representative embodiments and modes for carrying out the subject disclosure when taken in connection with the accompanying drawings and the appended claims.

BRIEF DESCRIPTION OF THE DRAWINGS

The drawings described herein are for illustrative purposes only, are schematic in nature, and are intended to be exemplary rather than to limit the scope of the disclosure.

FIG. 7 is a partial perspective view illustration of the air purifier of FIGS. 1-6 showing wireless charging electronics and a cooling airflow in accordance with a possible construction.

The appended drawings are not necessarily to scale and may present a somewhat simplified representation of various preferred features of the present disclosure as disclosed herein, including specific dimensions, orientations, locations, and shapes. Details associated with such features will be determined in part by the intended application and use environment.

DETAILED DESCRIPTION

The subject disclosure may be embodied in many different forms. Representative examples are shown in the various drawings and described in detail below, with the understanding that the described embodiments are an exemplification of the disclosed principles, and not limitations of the broad aspects of the disclosure. To that end, elements and limitations described below, but not explicitly set forth in the claims, should not be incorporated into the claims, singly or collectively, by implication, inference, or otherwise. Moreover, the drawings discussed herein may not be to scale, and are provided purely for instructional purposes. Thus, the specific and relative dimensions shown in the Figures are not to be construed as limiting.

Additionally, unless specifically disclaimed: the singular includes the plural and vice versa; the words "and" and "or" shall be both conjunctive and disjunctive; the words "any" and "all" shall both mean "any and all"; and the words "including," "containing," "comprising," "having," along with permutations thereof and similar terms, shall each mean "including without limitation." Further, the words "example" or "exemplary" are used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. Moreover, words of approximation, such as "about," "almost," "substantially," "generally," "approximately," and the like, may each be used herein in the sense of "at, near, or nearly at," or "within 0-5% of," or "within acceptable manufacturing tolerances," or any logical combination thereof, for example.

Figure 1:
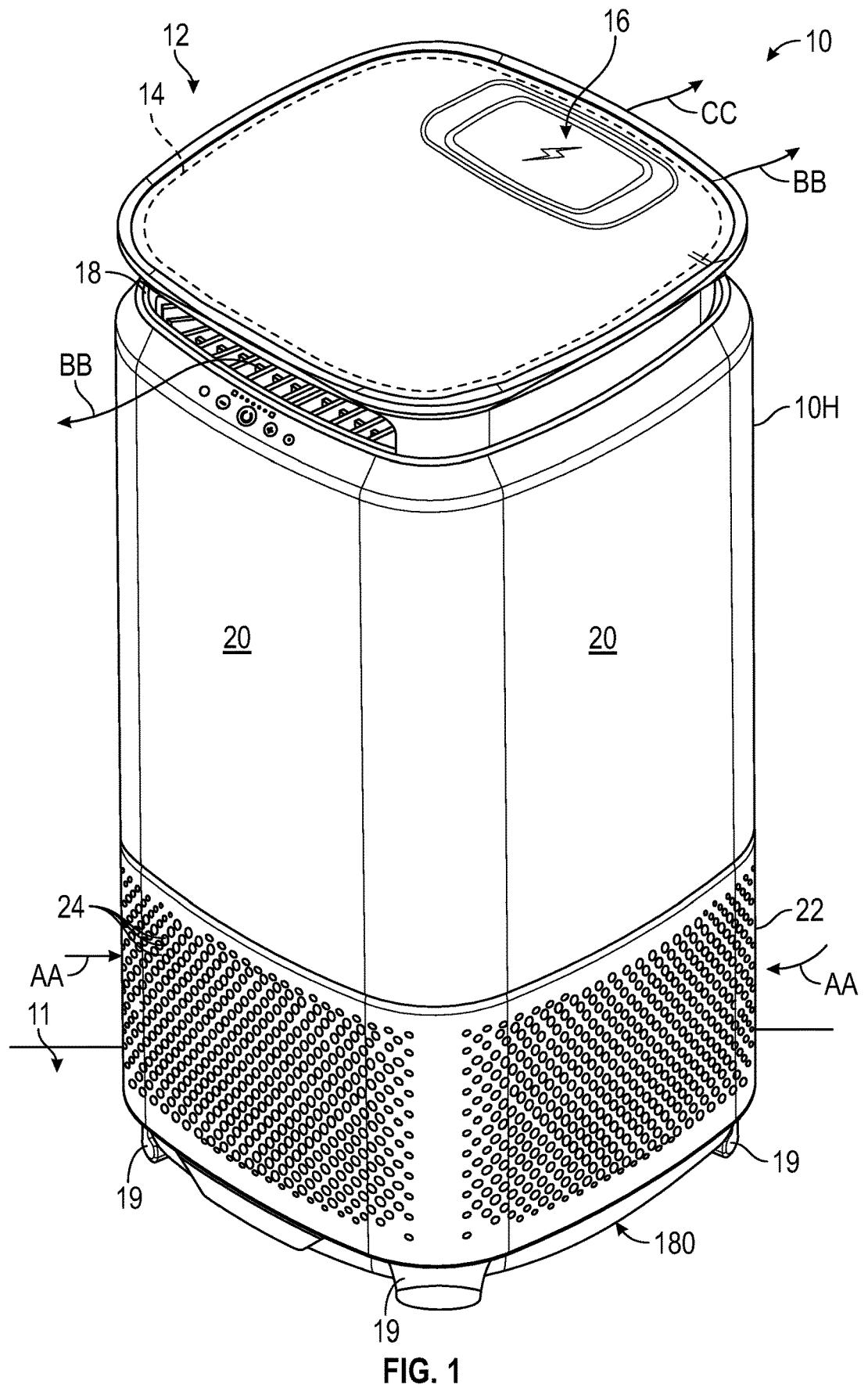
FIG. 1 is a perspective view illustration of an air purifier having a cooling bay for an electric circuit in accordance with the present disclosure.
Figure 2:
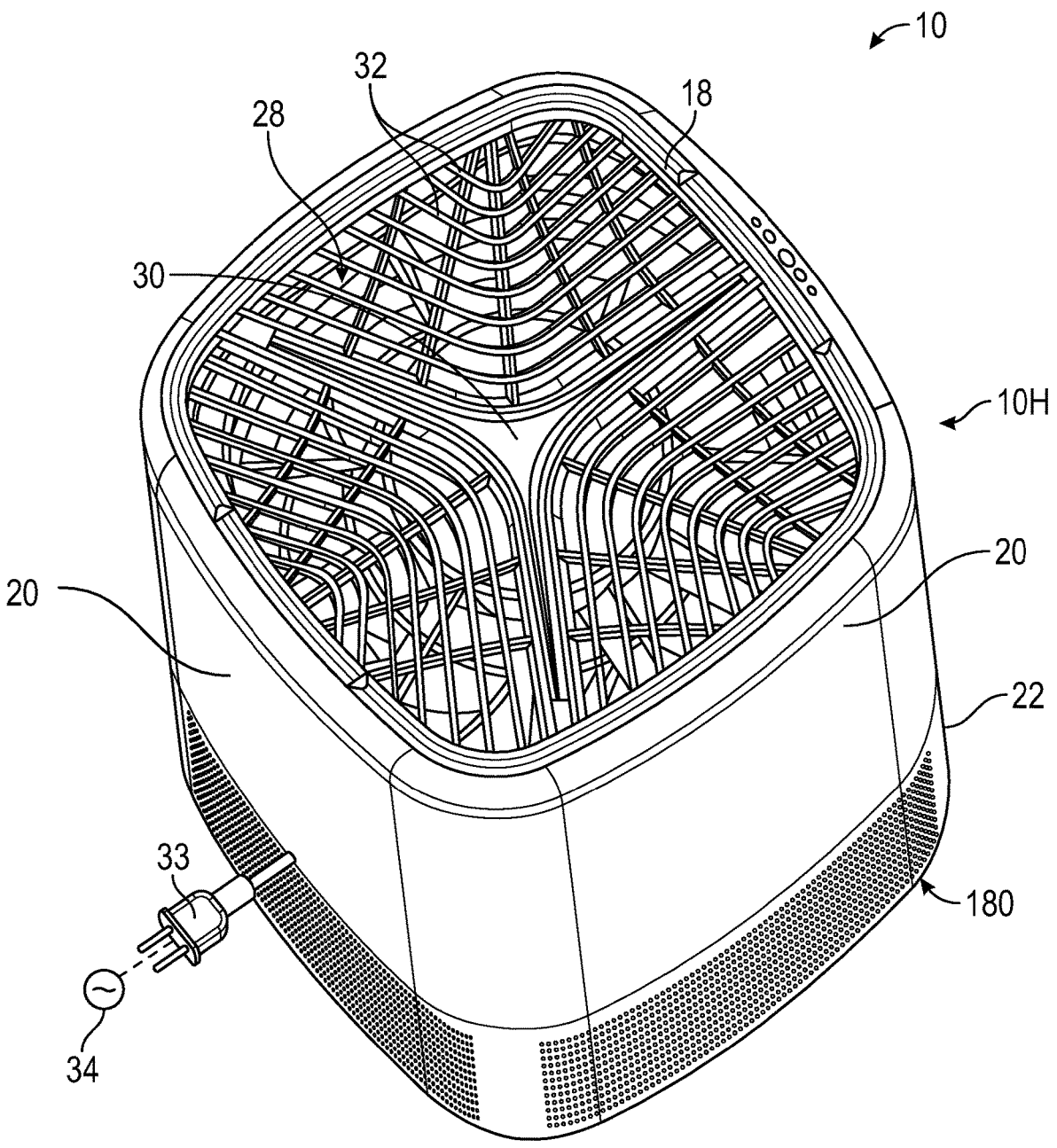
FIG. 2 is a perspective view illustration of the air purifier shown in FIG. 1 depicting a vented surface thereof.
Figure 3:
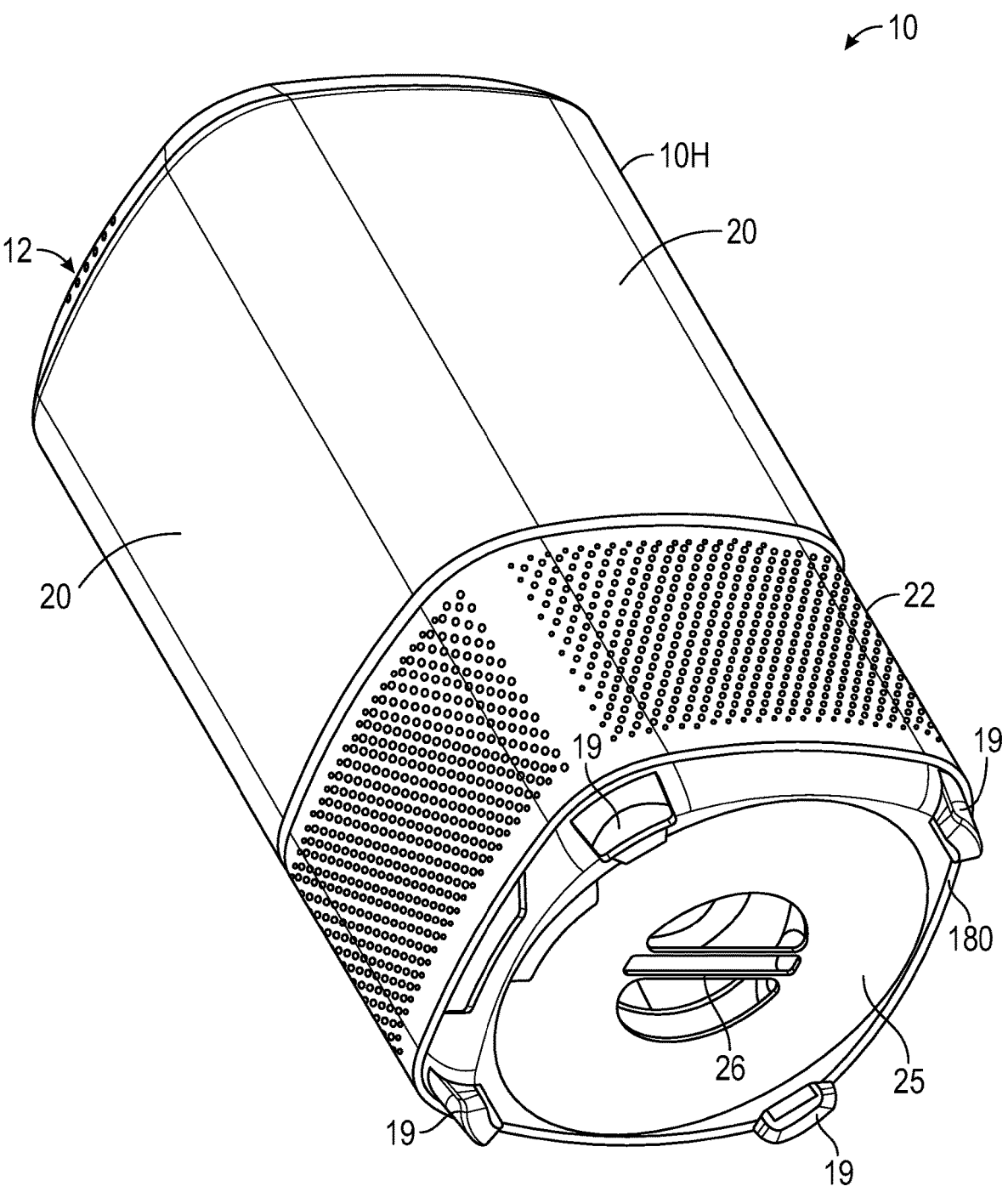
FIG. 3 is a perspective view illustration of the air purifier shown in FIGS. 1 and 2 depicting sidewalls and a bottom access cover of the air purifier.

Referring to the drawings, wherein like reference numbers refer to the same or like components in the several Figures, an air purifier 10 is shown in FIGS. 1-3 having a housing 10H. The air purifier 10 contemplated herein is equipped with a hollow top cover 12 that is positioned above and thus spans a vented top surface 18, with integral electronic cooling structure thereof being described in detail below with reference to FIGS. 4-9. As used herein, "top", "upper", "bottom", and "lower" as used herein have customary meanings relative to an upright use position of the described air purifier 10.

The hollow top cover 12 is configured to receive a portion of a total exhaust airflow from the air purifier 10 in an electronics bay 14 (also see FIG. 7) to help cool an electric circuit 15 residing therein. While omitted from the various Figures for illustrative simplicity, electrical power to the electric circuit 15 may be supplied via connection of the hollow top cover 12 to the housing 10H, e.g., via USB or a "pigtail" wire connection, using magnetic charging pads, etc.

Figure 7:
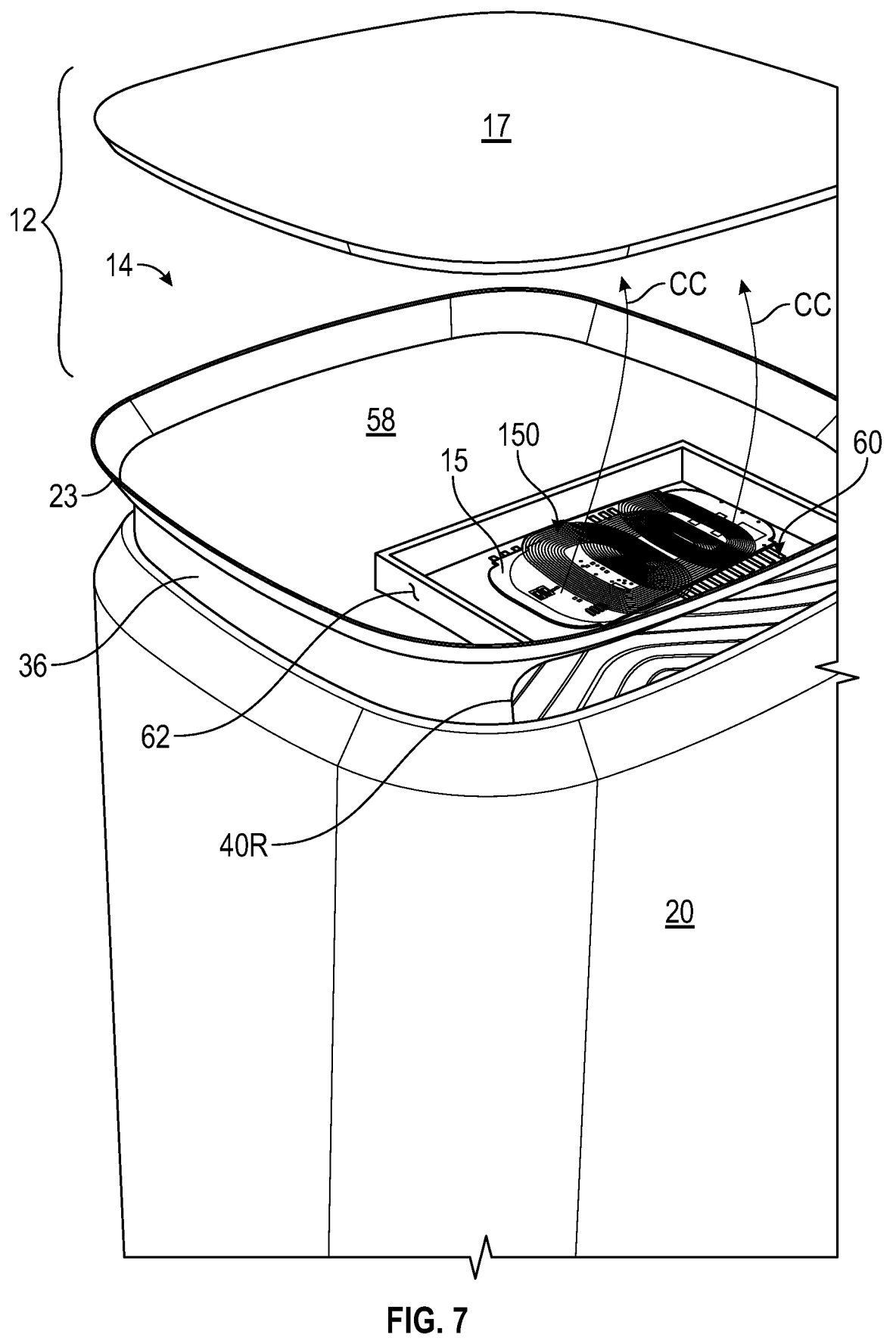

In the illustrated non-limiting exemplary embodiment of FIG. 7, the electric circuit 15 is configured as wireless charging electronics. When the electric circuit 15 is constructed in this manner, the hollow top cover 12 may include a charging pad 16 on which a user of the air purifier 10 of FIG. 1 may place a charging device, e.g., a smartphone, to commence a wireless charging process. Diversion of a portion of the relatively strong exhaust airflow from the air purifier 10 into the hollow top cover 12 in this manner enables more rapid and/or higher-power charging relative to using, e.g., heat sinks or other passive cooling methodologies.

The air purifier 10 of FIG. 1 is depicted in a normal upright position in which the air purifier 10 rests securely on a floor surface 11 or another sufficiently sturdy horizontal base. The housing 10H may be embodied as an elongated, generally rectangular enclosure constructed of molded plastic or another application-suitable material. The housing 10H in a possible construction includes a closed bottom surface 180 equipped with one or more feet 19, with the feet 19 in turn being configured to securely contact the floor surface 11.

In the non-limiting embodiment of FIG. 1, the respective top and bottom surfaces 18 and 180 of the housing 10H are joined together via sidewalls 20, with the sidewalls 20 being connected to or formed integrally with an intake base section 22. The intake base section 22 is perforated or otherwise permeable to air, and thus may include air intake openings 24, e.g., a network of through-holes collectively allowing the intake airflow (arrows AA) to be drawn from the surrounding ambient environment into the housing 10H. After filtration and possibly other purification processes within the housing 10H, filtered airflow (arrows BB) is discharged from the housing 10H through the vented top surface 18. At the same time, cooling airflow (arrow CC) laden to some extent with heat from the electric circuit 15 of FIG. 7 is exhausted from the electronics bay 14 of the hollow top cover 12.

As best shown in FIG. 2, with the hollow top cover 12 removed for illustrative clarity, the vented top surface 18 of the housing 10H includes a plurality of exhaust vents 28, below which is positioned a motorized fan assembly 30. Operational details of an embodiment of the air purifier 10 equipped with the motorized fan assembly 30 are set forth below with reference to FIG. 6. The exhaust vents 28 defined by or provided in the vented top surface 18 are open spaces formed in a web-like network of slat members 32. The exhaust vents 28 are sized, shaped, distributed, or otherwise configured to allow clean filtered airflow, represented in the various Figures by arrows BB, to be freely exhausted from the housing 10H to the surrounding ambient environment, with some of the filtered airflow first passing through the hollow top cover 12 as described herein. At the same time, the exhaust vents 28 prevent ingress of fingers or smaller objects to protect users of the air purifier 10 from inadvertent contact with the motorized fan assembly 30.

In a typical construction, the motorized fan assembly 30 used as a prime mover of air within the air purifier 10 is embodied as a polyphase/alternating current (AC) electrical motor, and thus has a power plug 33 configured to connect to a typical AC wall outlet or another offboard power supply 31. Other embodiments may employ a direct current (DC) motor, and therefore AC embodiments are exemplary and non-limiting of the present teachings. The air purifier 10 may be equipped with a control board 57 (see FIG. 6) operable for controlling an ON/OFF state of the air purifier 10, fan speed, display features/brightness, and other comfort settings, which occurs in response to user selections to a control panel 34 (see FIG. 4). In some aspects of the present disclosure, the air purifier 10 may be equipped with wireless communications functionality to allow the user to use a software application ("app") on a smartphone, tablet computer, or other computer device and thereby communicate remotely with the air purifier 10. Such a configuration would allow the user to control the various settings of the air purifier 10 without interacting directly with the control panel 34. With the air purifier 10 being arranged in the normal upright use position of FIG. 4, the control panel 34 is presented at an accessible location directly below the primary exhaust port 40F. The control panel 34 may include individual control input devices such as an on/off power button, fan speed controls, indicator lights, etc.

Referring briefly to FIG. 3, other aspects of the air purifier 10 shown in the exemplary embodiment of FIGS. 1 and 2 include a removable access cover 25 located on and forming part of the closed bottom surface 180. The removable access cover 25 can provide internal access to the air purifier 10 of FIGS. 1 and 2, such as for general maintenance. In the illustrated representative embodiment, the access cover 25 is circular in shape and includes a handle 26. To open the air purifier 10, such as when installing or replacing filter media (not shown) contained therein, a user grasps the handle 26 and the sidewalls 20 and thereafter rotates the removable access cover 25. A quarter-turn engagement mechanism (not shown) or another suitable closure such as a threaded fitting or rotatable tabs may be used to secure the removeable access cover 25 to the housing 10H when the removeable access cover 25 is in the illustrated installed position of FIG. 3.

Figure 4:
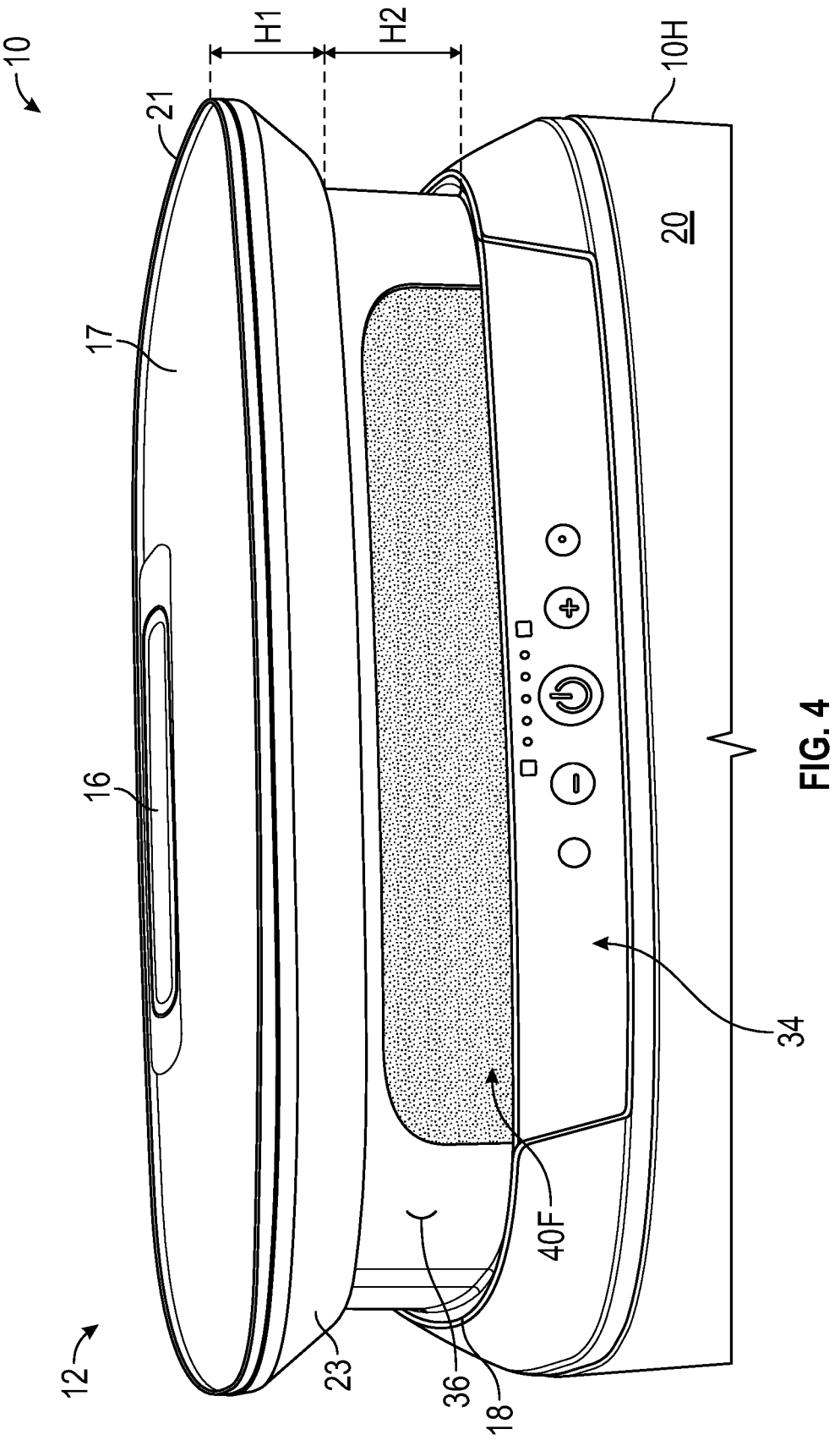
FIG. 4 is partial perspective view illustration of a hollow top cover of the air purifier depicted in FIGS. 1-3 showing a primary exhaust port and a control panel or user interface in accordance with a possible embodiment.

FIG. 4 is a partial perspective view illustration of the exemplary air purifier 10 shown in FIGS. 1-3 depicting the hollow top cover 12 in an installed position. The hollow top cover 12 contemplated herein may be a "clamshell" configuration in which a top surface 17 having a perimeter edge 21 is operatively connected to angled sidewalls 23 having a height H1. The angled sidewalls 23 in this particular embodiment slant inward toward a pedestal 36, e.g., a vertically-extending flange, with the pedestal 36 having a height H2. The hollow top cover 12 therefore has a total height of H1+H2, which may be about of about 1-2 inches (25.4 mm to about 50.8 mm). In a representative embodiment, the hollow top cover 12 is connected to or formed integrally with the pedestal 36, such that the pedestal 36 extends from the angled sidewalls 23 and ultimately rests on the vented top surface 18, with or without an accompanying connection thereto.

In the illustrated embodiment, the hollow top cover 12 with the integral pedestal 36 could be lifted from the vented top surface 18 of the air purifier and removed from the air purifier 10 to form the assembly shown in FIG. 2 when desired. As appreciated by those skilled in the art, such a configuration would allow a maximum amount of airflow to pass through the vents 28 in a vertical direction. When the hollow top cover 12 and the pedestal 36 are installed as shown in FIGS. 1 and 4, the hollow top cover 12, the pedestal 36, and the vented top surface 18 collectively define a primary exhaust port 40F, with "F" as used herein indicating a nominal front side of the air purifier 10. A substantially identical primary exhaust port 40R, with "R" indicating the diametrically opposite rear surface of the air purifier 10, may be similarly defined as best shown in FIGS. 5-8. The primary exhaust ports 40F and 40R may be embodied as generally rectangular and/or elongated openings as shown to provide a maximum amount of unimpeded exhaust airflow, which in turn is represented in FIG. 1 by arrows BB. Use of the hollow top cover 12 and the pedestal 36 in this manner allows a user to direct the filtered exhaust airflow (arrows BB) in a horizontal direction.

With the air purifier 10 being arranged in the normal upright use position of FIG. 4, the above-noted control panel 34 is presented at an accessible location directly below the primary exhaust port 40F. The control panel 34 may include individual control input devices such as an on/off power button, fan speed controls, indicator lights, etc.

Figure 5:
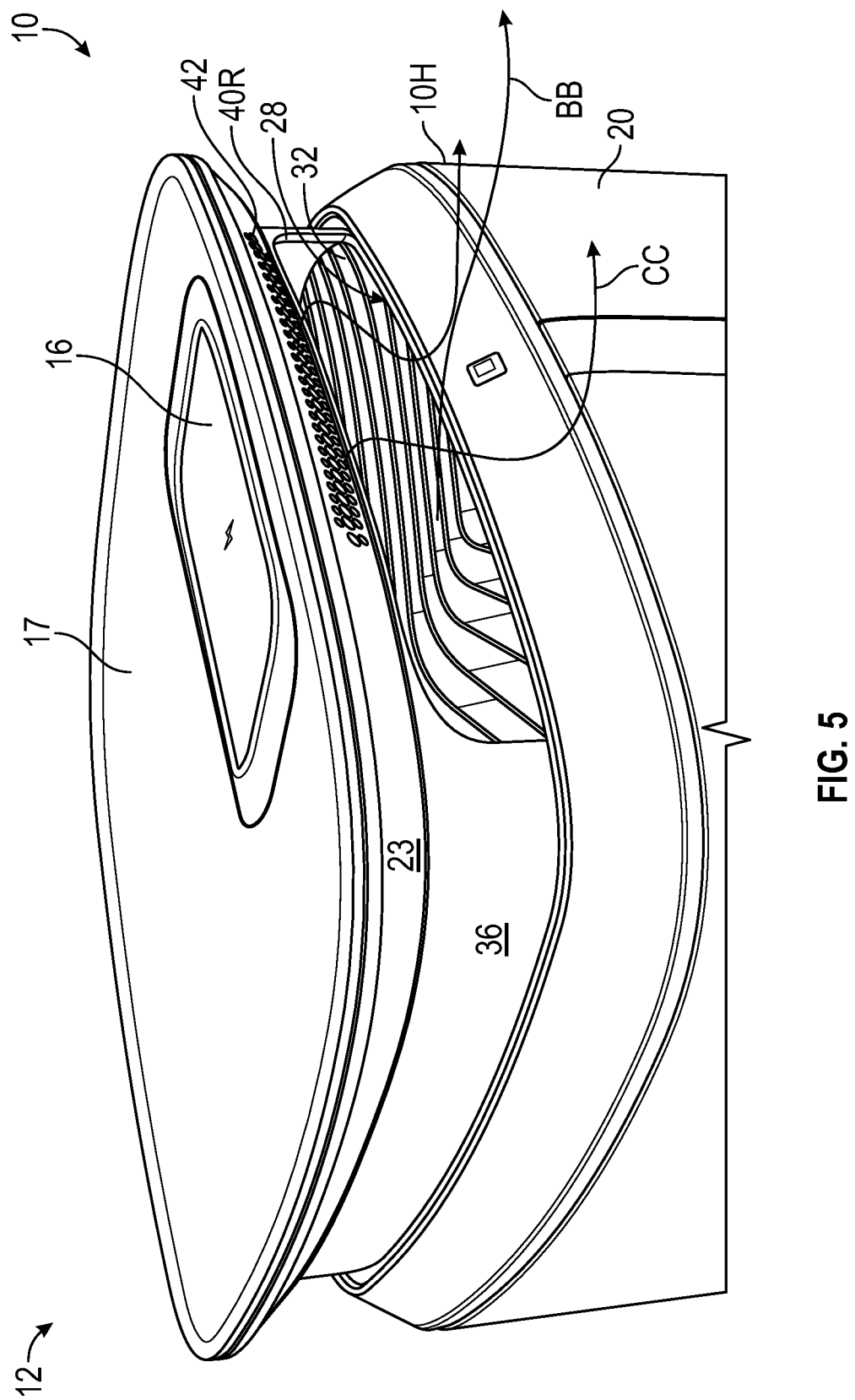
FIG. 5 is a partial perspective view illustration of the top cover of FIG. 4 showing a secondary exhaust port according to an exemplary construction.

ELECTRONICS COOLING: Within the scope of the present disclosure, the user can place a smartphone or another rechargeable device on the charging pad 16 of FIGS. 1, 4, and 5 to commence wireless charging operations during operation of the air purifier 10. A small portion of the total exhaust airflow produced by the air purifier 10, e.g., about 10% to about 20%, is diverted in this embodiment through the hollow top cover 12 when the hollow top cover 12 is properly installed as shown in FIGS. 1, 4, and 5. Although diversion of the main airstream may provide certain attendant benefits, including minimal backpressure or flow losses, those skilled in the art will appreciate that more than 10-20% or substantially all of the filtered airflow (arrows BB) can be diverted through the hollow top cover 12 in other embodiments, albeit with modifications to the relative positions of the primary exhaust ports 40F, 40R and the secondary exhaust ports 42. In the illustrated configuration, the diverted airflow circulates within the electronics bay 14 (see FIG. 7) and thus acts as cooling airflow (arrows CC of FIGS. 7 and 8) to thermally regulate the electric circuit 15 residing therein. The cooling airflow (arrows CC) laden with heat from the electric circuit 15 is then exhausted to the surrounding ambient environment through one or more secondary exhaust ports 42 formed in or defined by the hollow top cover 12, with a negligible impact on overall flow performance of the air purifier 10.

As shown in FIG. 5, the secondary exhaust port 42 may be embodied as a plurality of through-holes or openings in the angled sidewalk 23 of the hollow top cover 12. For example, multiple rows of circular through-holes or openings of another suitable shape could be arranged above and/or adjacent to the primary exhaust port 40R. The secondary exhaust port 42 in this exemplary configuration vents the cooling airflow (arrows CC) concurrently with normal exhausting of the filtered airflow (arrows BB). The number, shape, size, and distribution of such openings ultimately determines the volume of the cooling airflow (arrows CC), as appreciated in the art, with the actual arrangement being application-dependent.

Figure 6:
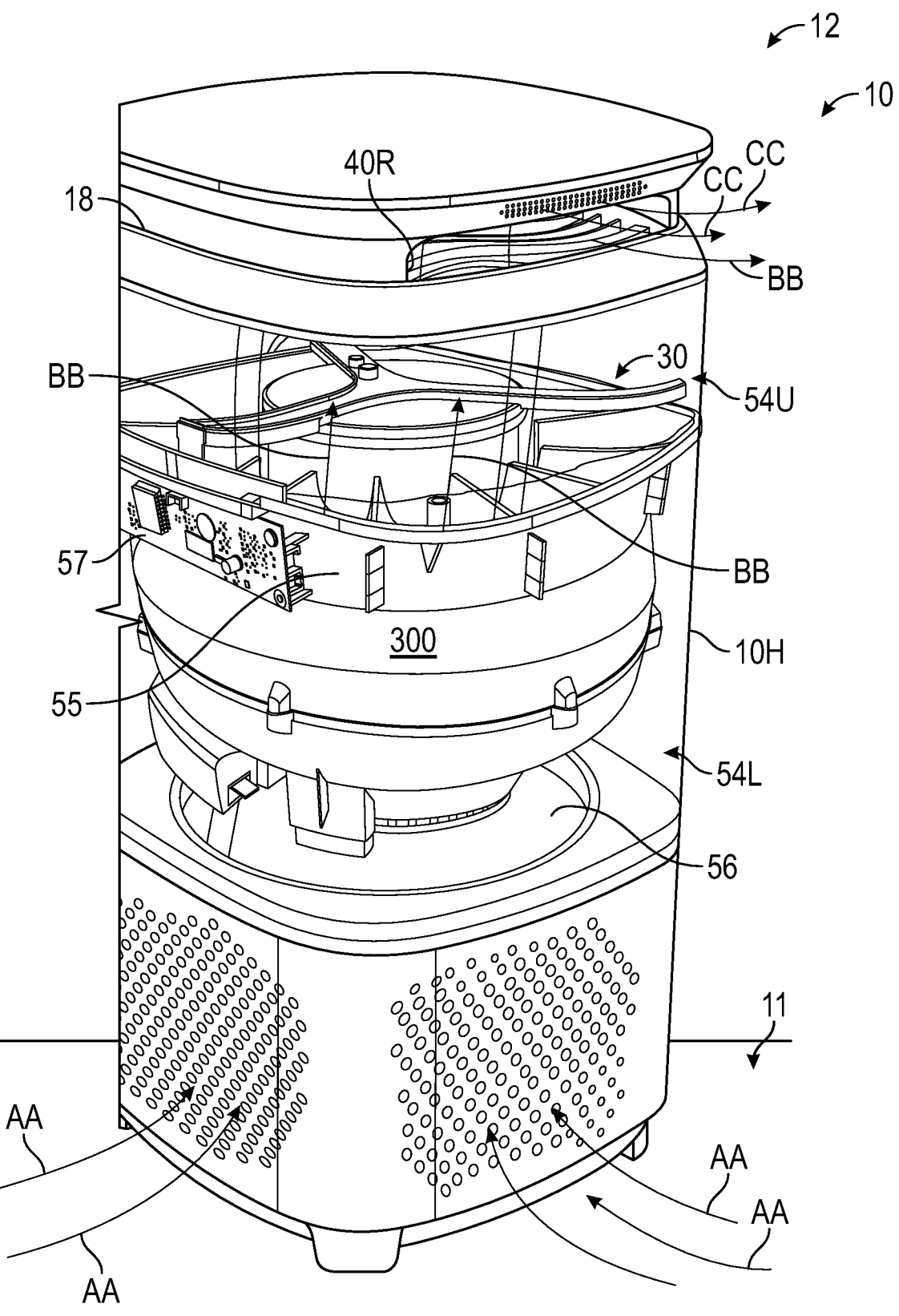
FIG. 6 is a partial perspective view illustration of the air purifier of FIGS. 1-5 with the sidewalls of FIG. 3 shown transparently to illustrate internal structure of the air purifier.

Referring briefly to FIG. 6, the housing 10H of the air purifier 10 shown in FIG. 1, with its sidewalk 20 of FIG. 1 shown as transparent for illustrative clarity, is configured to surround and thus define an interior volume 50. A divider plate 52, e.g., a planar piece of sufficiently rigid molded plastic, may be positioned within the interior volume 50 to effectively separate the interior volume 50 into respective upper and lower chambers 54U and 54L. In a possible embodiment, a fan shroud 55 at least partially surrounds or envelops the motorized fan assembly 30, with a motor housing 300 thereof being disposed within the interior volume 50. The control board 57 for regulating powerflow to and operation of the motorized fan assembly 30 may be attached to the motorized fan assembly 30 or the fan shroud 55 within the interior volume 50 as shown. Thus, the fan shroud 55 can be used to connect to the housing 10H, support the weight of the motorized fan assembly 30, and protect the motorized fan assembly 30 from debris and possible damage.

The inlet airflow (arrows AA) drawn into the interior volume 50 of the air purifier 10 by operation of the motorized fan assembly 30 is forced through a filter element 56 to produce filtered airflow (arrows BB). In a typical embodiment, the filter element 56 includes a pleated cellulose or fiberglass media having an application-suitable efficiency. For example, the filter element 56 could be a cylindrical single or double open end (SOE or DOE) particulate element, for instance a HEPA filter as appreciated in the art. However, the actual construction of the filter element 56 may vary with the intended application and may include other layers such as a carbon fiber wrap. The filtered airflow (arrow BB) is ultimately discharged to the surrounding ambient environment through the vented top surface 18 and the primary exhaust ports 40R and 40F, with some of the filtered airflow (arrows BB) diverted through the hollow top cover 12 as the cooling air (arrows CC) set forth above. This cooling air (arrows CC is then discharged via the secondary exhaust ports 42.

Referring to FIG. 7, the hollow top cover 12 defines the electronics bay 14. In the illustrated embodiment of FIG. 7, the electronics bay 14 contains the electric circuit 15 in the form of wireless charging electronics 150. As appreciated in the art, inductive charging requires the use of multiple loops or coils of copper or another suitable electrical conductor. Passage of an electric current through such coils generates a time-variant magnetic field, which in turn couples with mating coils in the smartphone or other charging device situated on the surface 17. Heat generated during the wireless charging process would otherwise build within the electronics bay 14, which is an enclosed cavity of a relatively small volume. Therefore, the hollow top cover 12 is configured to admit the cooling airflow (arrows CC) into the electronics bay 14 for the purpose of cooling the electric circuit 15.

In particular, a floor 58 of the electronics bay 14 can define or be equipped with floor vents 60, for instance parallel through-slots in the floor 58 of the hollow top cover 12. An optional perimeter fence 62 may be constructed around the electric circuit 15 to help isolate or restrict the cooling airflow (arrows CC) to the general area of the electric circuit 15 for optimal cooling. In such an embodiment, the electric circuit 15 may be mounted or positioned directly above the floor vents 60, e.g., using posts or standoffs. Airflow passing through the floor vents 60 will therefore extract heat from the electric circuit 15 before being exhausted to the ambient environment through the secondary exhaust ports 42 (see FIG. 5).

Figure 8:
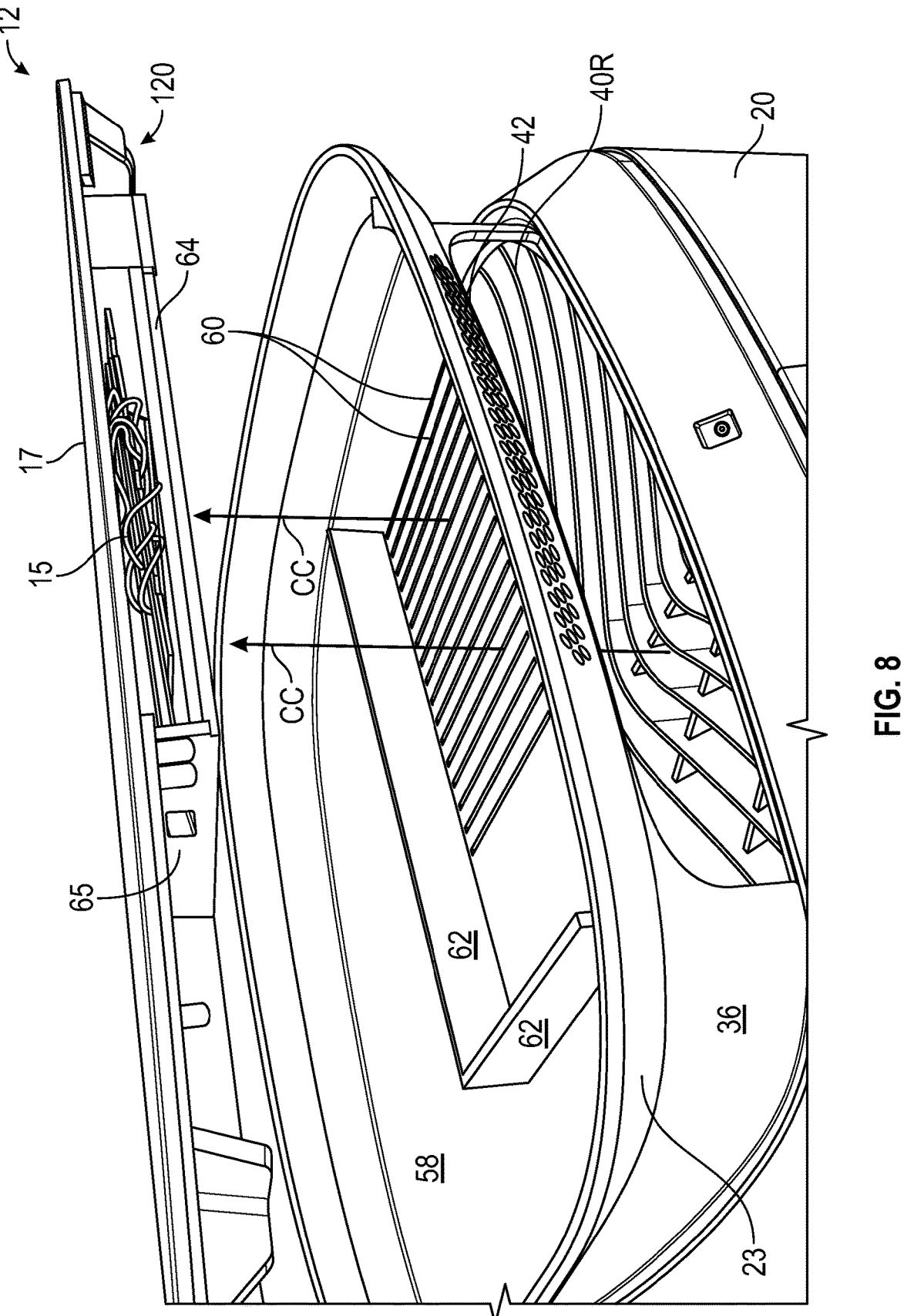
FIG. 8 is a partially-exploded perspective view illustration of the air purifier of FIGS. 1-7 showing an embodiment of the electronics bay within the hollow top cover.
Figure 9:
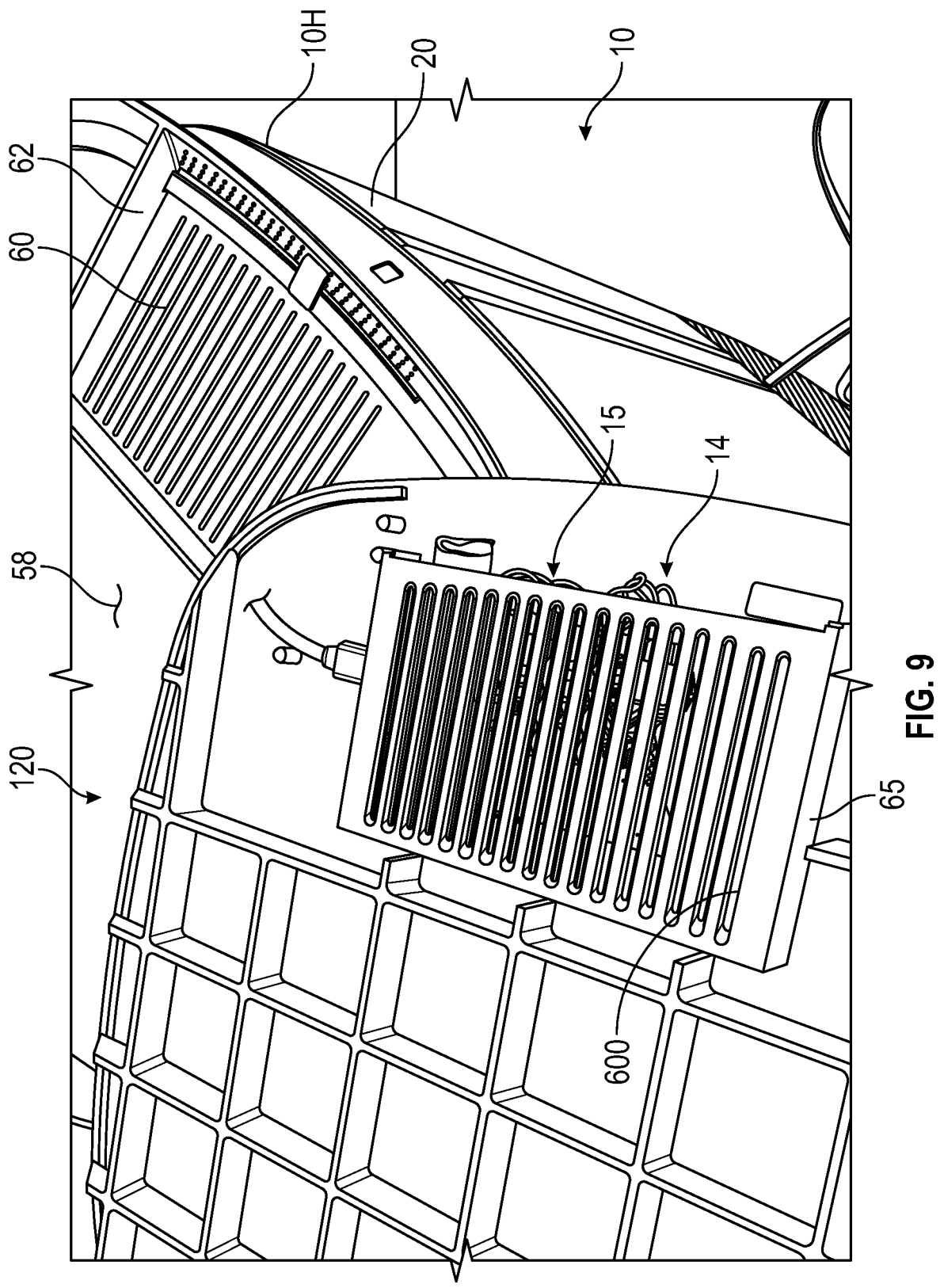
FIG. 9 is a partially-exploded perspective view illustration of the electronics bay shown in FIG. 8.

An alternative construction is shown in FIGS. 8 and 9 in which the electric circuit 15 is contained within a plenum 64 that is connected to and/or suspended from a cover piece 120 of the top cover 12, with the cover piece 120 forming a ceiling of the electronics bay 14. The plenum 64 may be generally rectangular as shown in FIG. 9, with sidewalls 65 (FIG. 8) that nest within the perimeter fence 62 when the cover piece 120 is connected to the angled sidewalls 23. In such an embodiment, the cooling airflow (arrows CC) passes through the floor vents 60 as with the embodiment of FIG. 7, and then flows into the plenum 64 through mating plenum vents 600, for instance parallel through-slots as shown. The cover piece 120 of FIG. 8 is shown as being inverted on top of the air purifier 10 to better illustrate the plenum vents 600. In the installed state of FIG. 1, therefore, the vents 60 and 600 would align to allow the cooling airflow (arrows CC) to pass freely from the floor vents 60 and into the plenum vents 600. Once the airflow (arrows CC) enters the plenum 64, the cooling airflow (arrows CC) circulates around the electric circuit 15 contained therein. Extracted waste heat then exits the electronics bay 14 through the secondary exhaust ports 42 of FIG. 8.

The air purifier 10 described above is therefore equipped with several structural features that may be used separately or in different combinations to enable direct cooling of the electric circuit 15. Benefits of situating the electric circuit 15 in the exhaust stream of the air purifier 10 include the ability to eliminate passive cooling devices such as heat sinks or cooling fins, which would otherwise increase packing space and mass of the air purifier 10. For embodiments in which the electric circuit 15 is configured as the wireless charging electronics 150 of FIG. 7, the disclosed structural solutions can enable higher power charging and reduced charging times. These and other attendant benefits will be appreciated by those skilled in the art in view of the forgoing disclosure.

In view of the foregoing disclosure, one skilled in the art will appreciate that related methodologies may be implemented that take advantage of the various structural features described above. For example, a method for cooling the electric circuit 15 using the air purifier 10 according to an embodiment includes positioning the hollow top cover 12 on the vented top surface 18 of the air purifier 10. The hollow top cover 12 defines therein the electronics bay 14 containing the electric circuit 15, floor vents 60 configured to admit a portion of the filtered airstream (arrows BB) from the air purifier 10 into the electronics bay 14 as the cooling airstream (arrows CC), the primary exhaust port(s) 40F and/or 40R for discharging the filtered airstream (arrows BB) to the surrounding ambient environment, and the secondary exhaust port(s) 42 for discharging the cooling airstream (arrows CC) to the surrounding ambient environment. The method may include generating the filtered airstream (arrows BB) via the motorized fan assembly 30, and also directing the cooling airstream (arrows CC) through the floor vents 60 and into the electronics bay 14 to thereby cool the electric circuit 15. The electric circuit 15 in some configurations includes the wireless charging electronics 150, in which case the method may include directing the cooling airstream (arrows CC) through the floor vents 60 and into the electronics bay 14 to cool the wireless charging electronics 150.

The following Clauses provide some example configurations of the air purifier 10 disclosed herein.

Clause 1: An air purifier comprising: a housing having a vented upper surface; a motorized fan assembly positioned within an interior volume of the housing and operable for discharging a filtered airstream through the vented upper surface; a hollow top cover at least partially defining therein an electronics bay, floor vents configured to admit at least a portion of the filtered airstream into the electronics bay as a cooling airstream, at least one primary exhaust port for discharging the filtered airstream to a surrounding ambient environment, and at least one secondary exhaust port for discharging the cooling airstream to the surrounding ambient environment; and an electric circuit positioned in the electronics bay within the cooling airstream.

Clause 2: The air purifier of clause 1, wherein the hollow top cover includes angled sidewalls, and the at least one secondary exhaust port includes a plurality of through-holes in one of the angled sidewalls.

Clause 3: The air purifier of clause 2, wherein the housing includes a front and a rear, and wherein the primary exhaust port includes a rear exhaust port positioned adjacent to the plurality of through-holes.

Clause 4: The air purifier of clauses 2 or 3, wherein the hollow top cover includes a cover piece forming a ceiling of the electronics bay and a pedestal connected to the angled sidewalls, and wherein the pedestal at least partially defines the at least one primary exhaust port.

Clause 5: The air purifier of any of clauses 1-4, wherein the floor vents include a plurality of parallel through-slots in a floor of the hollow top cover.

Clause 6: The air purifier of any of clauses 1-5, wherein the electric circuit is mounted directly above the floor vents.

Clause 7: The air purifier of any of clauses 1-6, further comprising: a plenum connected to the hollow top cover and defining a plurality of plenum vents in fluid communication with the floor vents, wherein the electronics bay is surrounded by the plenum.

Clause 8: The air purifier of clause 7, wherein the plenum vents include a plurality of parallel through-slots.

Clause 9: The air purifier of any of clauses 1-8, wherein the electric circuit includes wireless charging electronics.

Clause 10: The air purifier of any of clauses 1-9, wherein the hollow top cover includes a rectangular fence that is connected to a floor of the hollow top cover, and wherein the rectangular fence surrounds the electric circuit and the floor vents.

Clause 11: A hollow top cover assembly for an air purifier, the air purifier comprising a housing having a vented upper surface and a motorized fan assembly positioned within an interior volume of the housing and operable for discharging a filtered airstream through the vented upper surface to a surrounding ambient environment, the hollow top cover assembly comprising: a cover piece forming a ceiling of an electronics bay; a floor defining floor vents configured to admit a portion of the filtered airstream into the electronics bay as a cooling airstream when the hollow top cover is connected to or positioned on the vented upper surface; angled sidewalls connected to the cover piece and defining at least one secondary exhaust port for discharging the cooling airstream to the surrounding ambient environment; a pedestal connected to the floor, wherein the pedestal at least partially defines at least one primary exhaust port configured to discharge the filtered airstream to the surrounding ambient environment; and an electric circuit positioned in the electronics bay within the cooling airstream.

Clause 12: The hollow top cover assembly of clause 11, wherein the at least one secondary exhaust port includes a plurality of through-holes in one of the angled sidewalls.

Clause 13: The hollow top cover assembly of clause 12, wherein the at least one primary exhaust port includes a rear exhaust port positioned adjacent to the plurality of through-holes.

Clause 14: The hollow top cover assembly of any of clauses 11-13, wherein the floor vents include a plurality of parallel through-slots.

Clause 15: The hollow top cover assembly of any of clauses 11-14, wherein the electric circuit is mounted directly above the floor vents.

Clause 16: The hollow top cover assembly of any of clauses 11-15, further comprising: a plenum connected to the hollow top cover and defining a plurality of plenum vents in fluid communication with the floor vents, wherein the electronics bay is surrounded by the plenum.

Clause 17: The hollow top cover assembly of clause 16, wherein the plenum vents include a plurality of parallel through-slots.

Clause 18: The hollow top cover assembly of any of clauses 11-17, wherein the electric circuit includes wireless charging electronics.

Clause 19: A method for cooling an electric circuit using an air purifier, the method comprising: positioning a hollow top cover on a vented upper surface of the air purifier, the hollow top cover defining therein an electronics bay containing an electric circuit, floor vents configured to admit a portion of a filtered airstream from the air purifier into the electronics bay as a cooling airstream, at least one primary exhaust port for discharging the filtered airstream to a surrounding ambient environment, and at least one secondary exhaust port for discharging the cooling airstream to the surrounding ambient environment; generating the filtered airstream via the motorized fan assembly; and directing the cooling airstream through the floor vents and into the electronics bay to thereby cool the electric circuit.

Clause 20: The method of clause 19, wherein the electric circuit includes wireless charging electronics, and wherein directing the cooling airstream through the floor vents and into the electronics bay to thereby cool the electric circuit includes cooling the wireless charging electronics.

While some of the best modes and other embodiments have been described in detail, various alternative designs and embodiments exist for practicing the present teachings defined in the appended claims. Those skilled in the art will recognize that modifications may be made to the disclosed embodiments without departing from the scope of the subject disclosure. Moreover, the present concepts expressly include combinations and sub-combinations of the described elements and features. The detailed description and the drawings are supportive and descriptive of the present teachings, with the scope of the present teachings defined solely by the claims.

What is claimed is:

1. An air purifier comprising:
a housing having a vented upper surface;
a motorized fan assembly positioned within an interior volume of the housing and operable for discharging a filtered airstream through the vented upper surface;
a hollow top cover at least partially defining therein an electronics bay, floor vents configured to admit at least a portion of the filtered airstream into the electronics bay as a cooling airstream, at least one primary exhaust port for discharging the filtered airstream to a surrounding ambient environment, and at least one secondary exhaust port for discharging the cooling airstream to the surrounding ambient environment; and
an electric circuit positioned in the electronics bay within the cooling airstream, wherein the hollow top cover includes angled sidewalls, and the at least one secondary exhaust port includes a plurality of through-holes in one of the angled sidewalls.

2. The air purifier of claim 1, wherein the housing includes a front and a rear, and wherein the primary exhaust port includes a rear exhaust port positioned on the rear of the housing adjacent to the plurality of through-holes.

3. The air purifier of claim 1, wherein the hollow top cover includes a pedestal connected to the angled sidewalls, and wherein the pedestal at least partially defines the at least one primary exhaust port.

4. The air purifier of claim 1, wherein the floor vents include a plurality of parallel through-slots in a floor of the hollow top cover.

5. The air purifier of claim 1, wherein the electric circuit is mounted directly above the floor vents.

6. The air purifier of claim 1, further comprising:
a plenum connected to the hollow top cover and defining a plurality of plenum vents in fluid communication with the floor vents, wherein the electronics bay is surrounded by the plenum.

7. The air purifier of claim 6, wherein the plenum vents include a plurality of parallel through-slots.

8. The air purifier of claim 1, wherein the electric circuit includes wireless charging electronics.

9. The air purifier of claim 1, wherein the hollow top cover includes a rectangular fence that is connected to a floor of the hollow top cover, and wherein the rectangular fence surrounds the electric circuit and the floor vents.

10. A hollow top cover assembly for an air purifier, the air purifier comprising a housing having a vented upper surface and a motorized fan assembly positioned within an interior volume of the housing and operable for discharging a filtered airstream through the vented upper surface to a surrounding ambient environment, the hollow top cover assembly comprising:

a cover piece forming a ceiling of an electronics bay;
a floor defining floor vents configured to admit a portion of the filtered airstream into the electronics bay as a cooling airstream when the hollow top cover is connected to or positioned on the vented upper surface;
angled sidewalls connected to the cover piece and defining at least one secondary exhaust port for discharging the cooling airstream to the surrounding ambient environment, wherein the at least one secondary exhaust port includes a plurality of through-holes in one of the angled sidewalls;
a pedestal connected to the floor, wherein the pedestal at least partially defines at least one primary exhaust port configured to discharge the filtered airstream to the surrounding ambient environment; and
an electric circuit positioned in the electronics bay within the cooling airstream.

11. The hollow top cover assembly of claim 10, wherein the at least one primary exhaust port includes a rear exhaust port positioned adjacent to the plurality of through-holes.

12. The hollow top cover assembly of claim 11, wherein the floor vents include a plurality of parallel through-slots.

13. The hollow top cover assembly of claim 10, wherein the electric circuit is mounted directly above the floor vents.

14. The hollow top cover assembly of claim 10, further comprising:
a plenum connected to the hollow top cover and defining a plurality of plenum vents in fluid communication with the floor vents, wherein the electronics bay is surrounded by the plenum.

15. The hollow top cover assembly of claim 14, wherein the plenum vents include a plurality of parallel through-slots.

16. The hollow top cover assembly of claim 10, wherein the electric circuit includes wireless charging electronics.

17. The air purifier of claim 1, wherein the hollow top cover includes a cover piece forming a ceiling of the electronics bay.

18. An air purifier comprising:
a housing having a vented upper surface;
a motorized fan assembly positioned within an interior volume of the housing and operable for discharging a filtered airstream through the vented upper surface;
a hollow top cover at least partially defining therein an electronics bay, floor vents configured to admit at least a portion of the filtered airstream into the electronics bay as a cooling airstream, at least one primary exhaust port for discharging the filtered airstream to a surrounding ambient environment, and at least one secondary exhaust port for discharging the cooling airstream to the surrounding ambient environment, wherein the primary exhaust port includes a rear exhaust port positioned on the rear of the housing adjacent to a plurality of through-holes, and wherein the hollow top cover includes a cover piece forming a ceiling of the electronics bay and a pedestal connected to the angled sidewalls, and wherein the pedestal at least partially defines the at least one primary exhaust port; and
an electric circuit including wireless charging electronics and positioned in the electronics bay within the cooling airstream, wherein the hollow top cover includes angled sidewalls, and the at least one secondary exhaust port includes the plurality of through-holes in one of the angled sidewalls, wherein the electric circuit is mounted directly above the floor vents, and wherein the floor vents include a plurality of parallel through-slots in a floor of the hollow top cover.

19. The air purifier of claim 18, further comprising:
a plenum connected to the hollow top cover and defining a plurality of plenum vents in fluid communication with the floor vents, wherein the electronics bay is surrounded by the plenum.

20. The air purifier of claim 19, wherein the plenum vents include a plurality of parallel through-slots.

\* \* \* \* \*